US008853822B2

(12) United States Patent
Katagiri et al.

(10) Patent No.: US 8,853,822 B2
(45) Date of Patent: Oct. 7, 2014

(54) SEMICONDUCTOR DEVICE

(71) Applicant: Elpida Memory, Inc., Tokyo (JP)

(72) Inventors: Mitsuaki Katagiri, Tokyo (JP); Hiroki Fujisawa, Tokyo (JP); Hiromasa Takeda, Tokyo (JP); Ken Iwakura, Tokyo (JP); Yutaka Uematsu, Kanagawa (JP); Go Shinkai, Kanagawa (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/679,156

(22) Filed: Nov. 16, 2012

(65) Prior Publication Data

US 2013/0140674 A1    Jun. 6, 2013

(30) Foreign Application Priority Data

Nov. 22, 2011    (JP) .................. 2011-255195

(51) Int. Cl.
*H01L 21/02* (2006.01)
*H01L 27/08* (2006.01)
*H03K 19/003* (2006.01)
*H01L 49/02* (2006.01)

(52) U.S. Cl.
CPC ............ *H01L 28/40* (2013.01); *H01L 27/0805* (2013.01); *H03K 19/00361* (2013.01)
USPC ......................................................... 257/532

(58) Field of Classification Search
USPC ....... 257/532, 296, 300, E27.016; 361/679.4, 361/763
See application file for complete search history.

(56) References Cited

U.S. PATENT DOCUMENTS

| 7,872,459 | B2 * | 1/2011 | Hojo et al. ..................... 323/273 |
| 2002/0024363 | A1 * | 2/2002 | Fujimoto ........................ 327/94 |
| 2008/0173914 | A1 * | 7/2008 | Hashimoto et al. ........... 257/296 |
| 2008/0203445 | A1 * | 8/2008 | Bernstein et al. ............. 257/278 |
| 2010/0259299 | A1 * | 10/2010 | Dennard et al. ................ 326/80 |

FOREIGN PATENT DOCUMENTS

| JP | 2008-085321 A | 4/2008 |
| JP | 2011-009291 A | 4/2008 |

* cited by examiner

*Primary Examiner* — Dao H Nguyen
*Assistant Examiner* — Tram H Nguyen
(74) *Attorney, Agent, or Firm* — Foley & Lardner LLP

(57) ABSTRACT

A semiconductor device according to this invention includes a first power line that supplies power to a first circuit, a second power line that supplies power to a second circuit, and a capacitive element that is provided between the first power line and the second power line.

10 Claims, 14 Drawing Sheets

SEMICONDUCTOR DEVICE

BACKGROUND OF THE INVENTION

1. Field of the Invention

The present invention relates to a semiconductor device.

2. Description of Related Art

The speed of handling signals has been increasing in recent semiconductor devices such as a DRAM (Dynamic Random Access Memory). The increase in the speed of signals makes a switching element (e.g., a CMOS (Complementary Metal Oxide Semiconductor)) in an internal circuit, such as an output circuit which outputs data to outside a semiconductor device, more susceptible to noise (SSN: Simultaneous Switching Noise) generated by switching.

An internal circuit in a semiconductor device is generally provided between a power line at a power potential and a ground line at ground potential and is supplied with power via the lines. If such an internal circuit is an output circuit or a circuit which needs to output many bits of data in parallel, such as a pre-stage circuit which supplies data to an output circuit, many of the switching elements that constitute the circuit may switch simultaneously. In this case, an abrupt current change occurs between a power line and a ground line, resonance current is generated due to the inductance component of lines for supplying power to the internal circuit, a parasitic capacitance (capacitance component) of the internal circuit, and the like, the difference in potential between the power line and the ground line varies, and noise is generated.

JP2008-85321A discloses a technique for reducing noise generated due to resonance current by providing a capacitive element whose capacitance can be changed between a power line and a ground line, for detecting the strength of noise generated due to resonance current, and for adjusting the capacitance of the capacitive element on the basis of the detection result.

JP2011-9291A discloses a technique for reducing the effect of the generation of resonance current by providing a capacitive element and a switch connected in series with the capacitive element between a power line and a ground line and, if the frequency of the resonance current falls within a predetermined range, shifting the frequency of the resonance current by turning the switch, on or off.

In some cases, in order to reduce resonance current generated in the above-described manner, an output circuit that consists of an internal circuit and a pre-stage circuit provided in front of the output circuit are supplied with power via different lines so as to prevent noise generated in the pre-stage circuit or the like from reaching the output circuit. The present inventors have recognized that, even if an output circuit and a pre-stage circuit are supplied with power by different lines, as described above, resonance current may be generated due to, e.g., an inductance component between a first line for supplying power to the output circuit and a second line for supplying power to the pre-stage circuit, resonance current may cause a difference in potential between the first line and the second line to vary, and noise may be generated.

SUMMARY

In one embodiment, there is provided a semiconductor device that comprises;

first and second power lines that supply an operating voltage to a first circuit, third and fourth power lines that supply an operating voltage to a second circuit different from the first circuit, and a first capacitive element that is provided between the first power line and the third power line.

According to the present invention, provision of capacitive elements among a plurality of lines for supplying power to circuits prevents variation in the difference in potential between the lines and enables a reduction in noise between different types of power supplies.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS (Exemplary Embodiments)

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
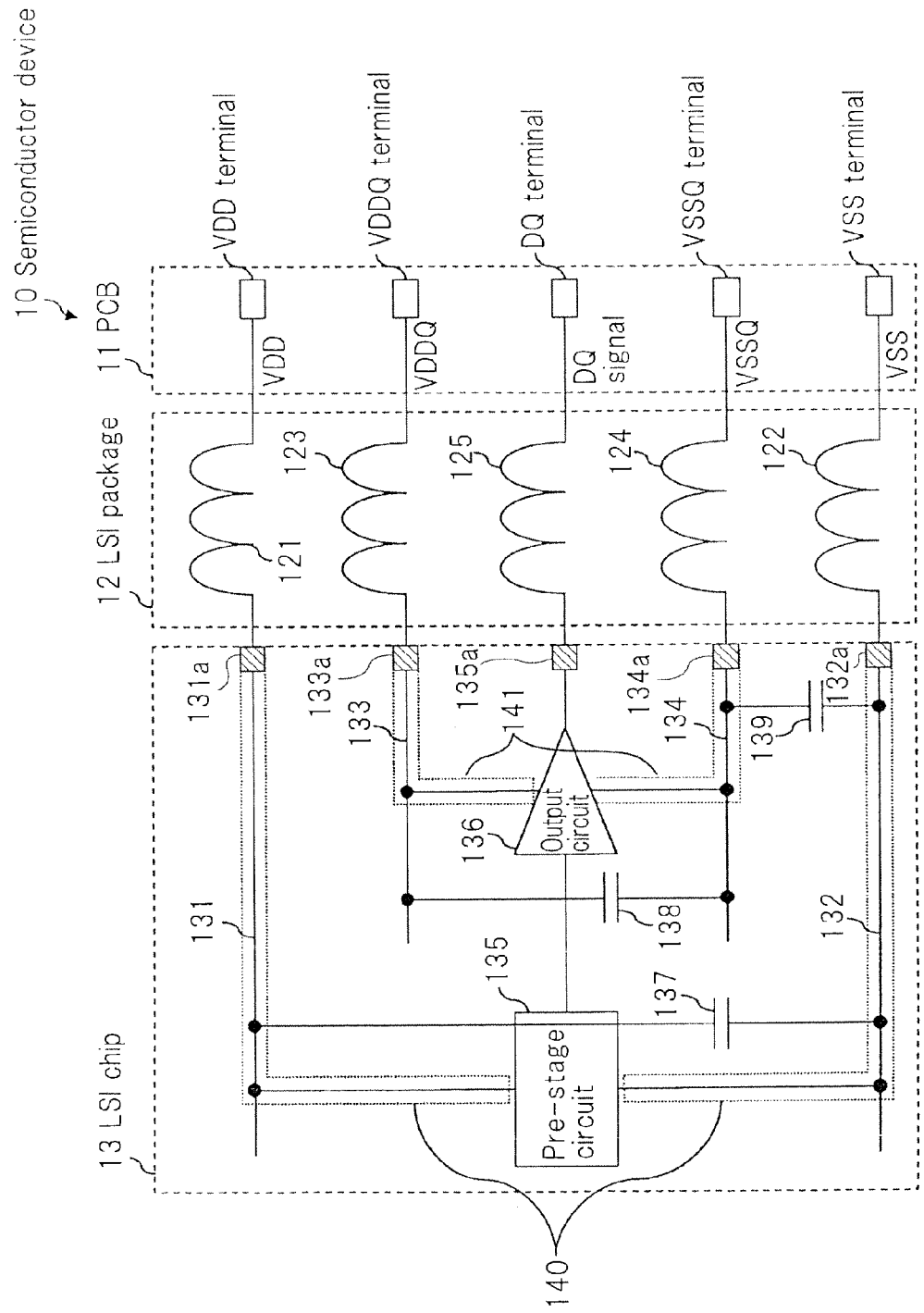
FIG. 1 is a diagram showing the configuration of a semiconductor device according to one exemplary embodiment and a first example of the present invention.

An exemplary embodiment is configured to include a first power line and a second power line for supplying power to a first circuit (e.g., an output circuit) that consists of an internal circuit, a third power line and a fourth power line for supplying power to a second circuit (e.g., an pre-stage circuit), and a capacitive element which is formed between the first power line and the third power line, as shown in FIG. 1.

That is, a capacitive element is provided between a line for supplying power to the first circuit and a line for supplying power to the second circuit, thereby allowing a reduction in noise generated between the lines.

Examples of the present invention will be described below with reference to the drawings.

First Example

The configuration of semiconductor device 10 according to a first example of the present invention will be described with reference to FIG. 1.

Note that noise that is generated between a line for supplying power to a first circuit and a line for supplying power to a second circuit when the first circuit and second circuit that constituting of internal circuits are supplied with power via different lines from different power supply terminals will be referred to as noise between different types of power supplies hereinafter.

Semiconductor device 10 includes a PCB (Printed Circuit Board) 11, LSI (Large Scale Integration) package 12, and LSI chip 13 which is mounted on PCB 11 with LSI package 12 therebetween.

A VDD terminal, a VSS terminal, a VDDQ terminal, a VSSQ terminal, and output terminal DQ are provided on PCB 11.

LSI package 12 includes lines 121 to 125 for connecting PCB 11 and LSI chip 13. Note that lines 121 to 125 have inductance components.

LSI chip 13 includes core power line 131, core ground line 132, I/O power line 133, I/O ground line 134, pre-stage circuit 135 which is supplied with power through core power line 131 and core ground line 132, output circuit 136 which is supplied with power through I/O power line 133 and I/O ground line 134, capacitive elements 137 to 139 which are capacitors, and chip terminal 131a to 135a.

Chip terminal 131a is connected to core power line 131 and line 121. Therefore, voltage VDD which is supplied from the VDD terminal is supplied to pre-stage circuit 135 via line 121 and core power line 131.

Chip terminal 132a is connected to core ground line 132 and line 122. Therefore, voltage VSS which is supplied from the VSS terminal is supplied to pre-stage circuit 135 via line 122 and core ground line 132. Note that voltage VSS is assumed to be at ground potential in the present example.

Chip terminal 133a is connected to I/O power line 133 and line 123. Therefore, voltage VDDQ which is supplied from the VDDQ terminal is supplied to output circuit 136 via line 123 and I/O power line 133.

Chip terminal 134a is connected to I/O ground line 134 and line 124. Therefore, voltage VSSQ which is supplied from the VSSQ terminal is supplied to output circuit 136 via line 124 and I/O ground line 134. Note that voltage VSSQ is assumed to be at ground potential in the present example.

Chip terminal 135a is connected to output circuit 136 and line 125. Output terminal DQ is connected to output circuit 136 via line 125 and receives data signal DQ output from output circuit 136.

Pre-stage circuit 135 is composed of, for example, a logic circuit which performs a logical operation. Pre-stage circuit 135 is operated by voltage VDD and voltage VSS supplied via first line 140 that is composed of core power line 131 and core ground line 132 which is at a potential lower than that of core power line 131 and outputs the result of performing a logical operation as data to output circuit 136.

Output circuit 136 is operated by voltage VDDQ and voltage VSSQ supplied via second line 141 that is composed of I/O power line 133 and I/O ground line 134 which is at a potential lower than that of I/O power line 133, and outputs data output from pre-stage circuit 135 as data signal DO to output terminal DQ via line 125.

As described above, the VDD terminal and VSS terminal are provided so as to correspond to pre-stage circuit 135, and the VDDQ terminal and VSSQ terminal are provided so as to correspond to output circuit 136 which is an internal circuit that operates differently from pre-stage circuit 135.

A configuration which reduces noise will be described.

Capacitive element 137 has one end connected to core power line 131 and the other end connected to core ground line 132. Since capacitive coupling of core power line 131 and core ground line 132 via capacitive element 137 keeps the difference in potential between core power line 131 and core ground line 132 constant, even if a plurality of switching elements in pre-stage circuit 135 simultaneously switch, noise can be reduced.

Capacitive element 138 has one end connected to I/O power line 133 and the other end connected to I/O ground line 134. Since capacitive coupling of I/O power line 133 and I/O ground line 134 via capacitive element 138 keeps the difference in potential between I/O power line 133 and I/O ground line 134 constant, even if a plurality of switching elements in output circuit 136 simultaneously switch, noise can be reduced.

Capacitive element 139 has one end connected to core ground line 132 and the other end connected to I/O ground line 134.

Resonance current may be generated between a first power supply path for supplying power to pre-stage circuit 135 and a second power supply path for supplying power to output circuit 136 due to the inductance components of lines 121 to 124 and parasitic capacitance components.

Core ground line 132 and I/O ground line 134 are at the same potential (ground potential) in terms of DC. The first and second power supply paths are each equivalent to an LC resonance circuit which is composed of inductance components of lines in the LSI package 12 and a parasitic capacitance component and has a finite impedance. For this reason, generation of resonance current causes a difference in potential between core ground line 132 and I/O ground line 134 to vary in terms of AC to generate noise between different types of power supplies. However, the provision of capacitive element 139 that has one end connected to core ground line 132 and the other end connected to I/O ground line 134 prevents variation in the difference in potential between the lines, which allows a reduction in the noise between different types of power supplies.

A method for determining the capacitance of capacitive element 139 will be described.

Figure 2:
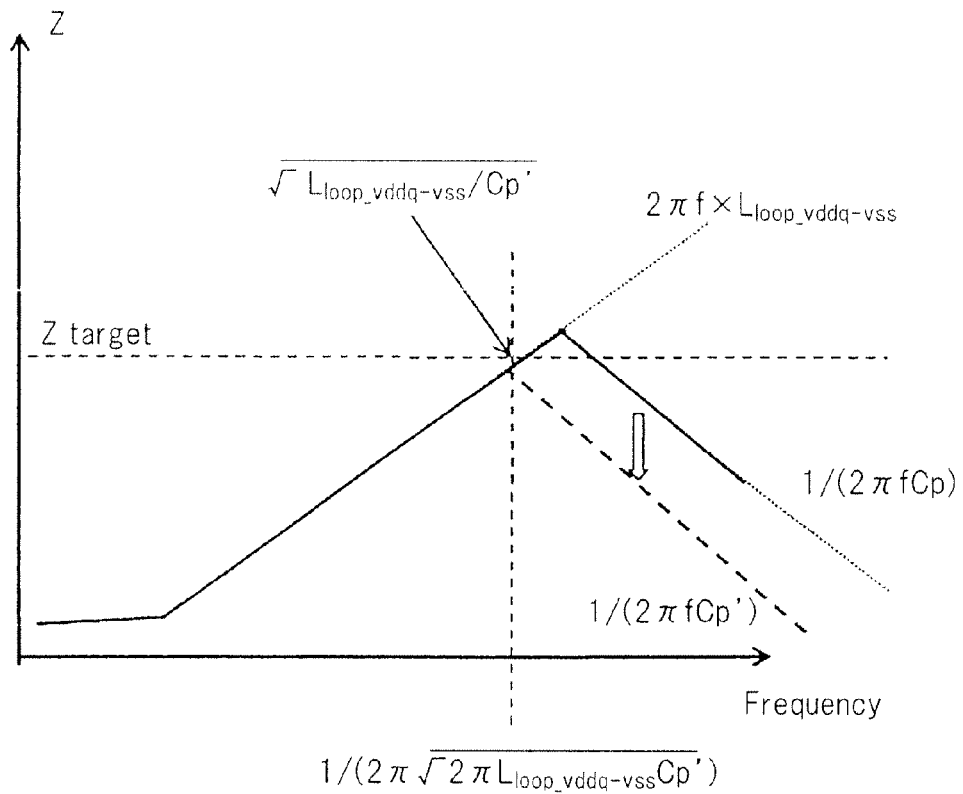
FIG. 2 is a graph for explaining a method for determining the capacitance of capacitive element 139 shown in FIG. 1.

Capacitive element 139 is provided in order to reduce the maximum value of the impedance between the VDDQ terminal and the VSS terminal. For this reason, as shown in FIG. 2, the impedance value between the VDDQ terminal and the VSS terminal at an anti-resonance frequency, as seen from output circuit 136, needs to be less than a predetermined value (target impedance value Ztarget).

Let $L_{loop\_vddq-vss}$ be the loop inductance between the VDDQ terminal and the VSS terminal, and $C_p'$ be the capacitance of capacitive element 139, and the impedance value between the VDDQ terminal and the VSS terminal is expressed by:
[Expression 1]

$$\sqrt{L_{loop\_vddq-vss}/C_p'}$$

The requirement that the impedance value between the VDDQ terminal and the VSS terminal at the anti-resonance frequency be less than target impedance value Ztarget is expressed in Expression (1):
[Expression 2]

$$\sqrt{L_{loop\_vddq-vss}/C_p'} < Z\text{target} \quad \text{Expression (1)}$$

As can be seen from Expression (1), capacitance $C_p'$ of capacitive element 139 needs to satisfy the condition expressed by Expression (2):
[Expression 3]

$$C_p' > L_{loop\_vddq-vss}/Z\text{target}^2 \quad \text{Expression (2)}$$

In Expression (2), target impedance value Ztarget is expressed by:
[Expression 4]

$$Z\text{target} = 10 V ddq^2/P\max(\Omega)$$

Note that Pmax represents the maximum current consumption of semiconductor device 10. The coefficient of 10 is an empirical value.

Effects achieved by providing capacitive element 139 will be described.

FIGS. 3A to 3G are graphs showing waveforms of signal DQ-A when one signal (signal DQ-A) of a plurality of data signals DQ is output at a fixed potential, and the other data signals are randomly driven. Note that FIGS. 3A to 3G show the waveforms of signal DQ-A when the capacitance of capacitive element 139 is 1 pF, when the capacitance of capacitive element 139 is 5 pF, when the capacitance of capacitive element 139 is 10 pF, when the capacitance of capacitive element 139 is 20 pF, when the capacitance of capacitive element 139 is 30 pF, when the capacitance of capacitive element 139 is 40 pF, and when the capacitance of capacitive element 139 is 50 pF, respectively. In FIGS. 3A to 3G, the ordinate represents the voltage [V] of signal DO-A while the abscissa represents a time [s].

Figure 3A:
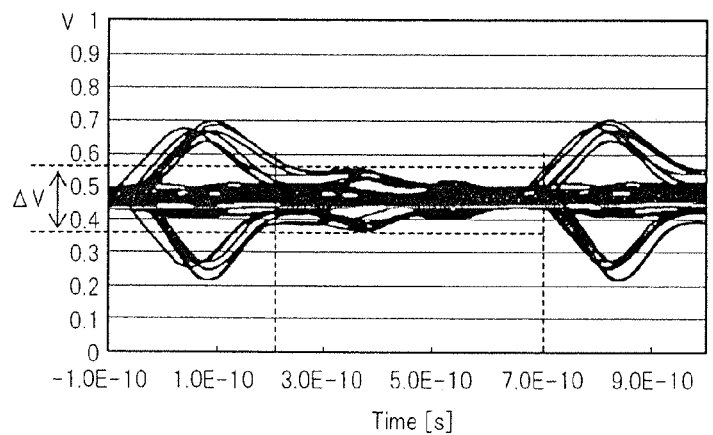
FIG. 3A is a graph showing an example of the output waveform of a DQ signal of the semiconductor device shown in FIG. 1.
Figure 3B:
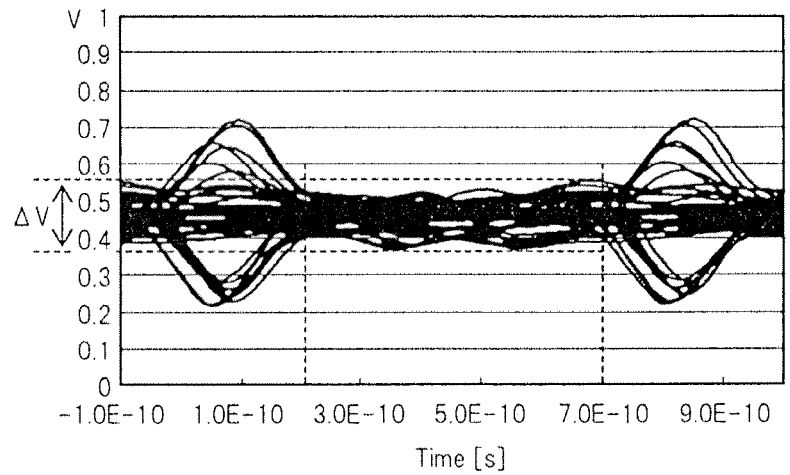
FIG. 3B is a graph showing an example of the output waveform of the DQ signal of the semiconductor device shown in FIG. 1.
Figure 3C:
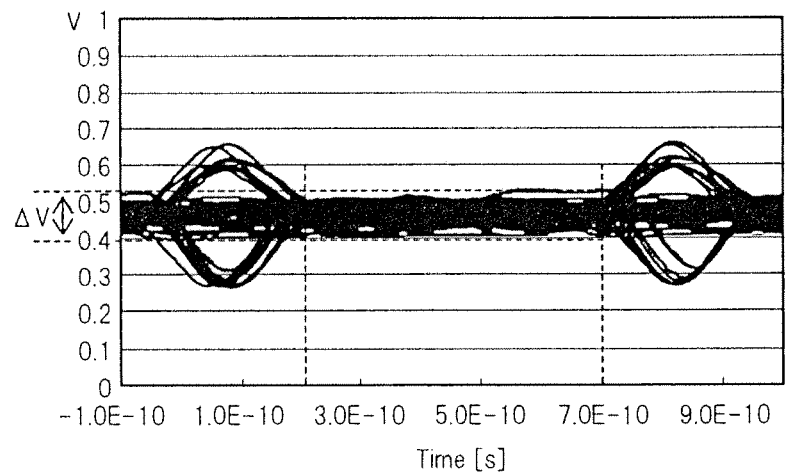
FIG. 3C is a graph showing an example of the output waveform of the DQ signal of the semiconductor device shown in FIG. 1.
Figure 3D:
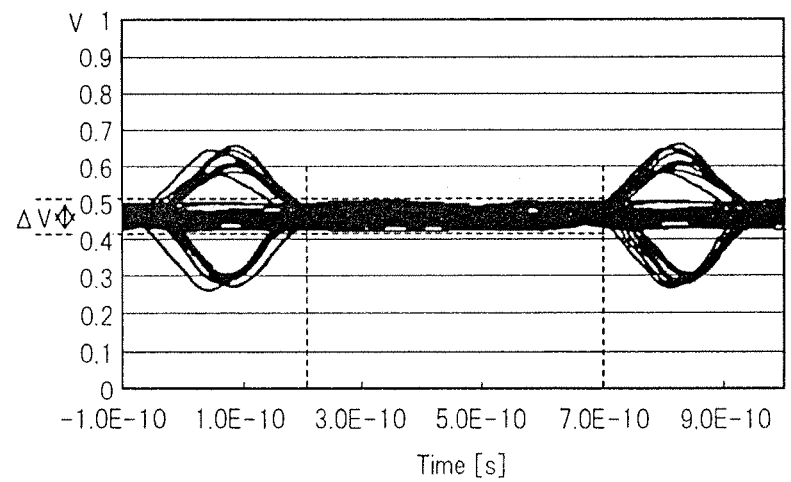
FIG. 3D is a graph showing an example of the output waveform of the DQ signal of the semiconductor device shown in FIG. 1.
Figure 3E:
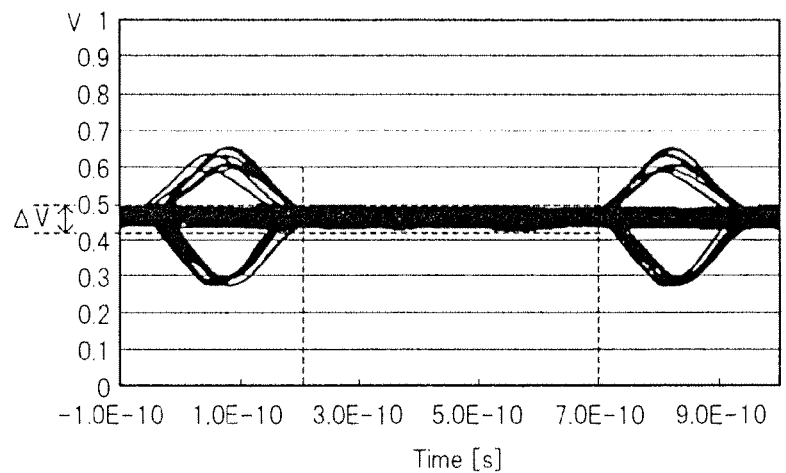
FIG. 3E is a graph showing an example of the output waveform of the DQ signal of the semiconductor device shown in FIG. 1.
Figure 3F:
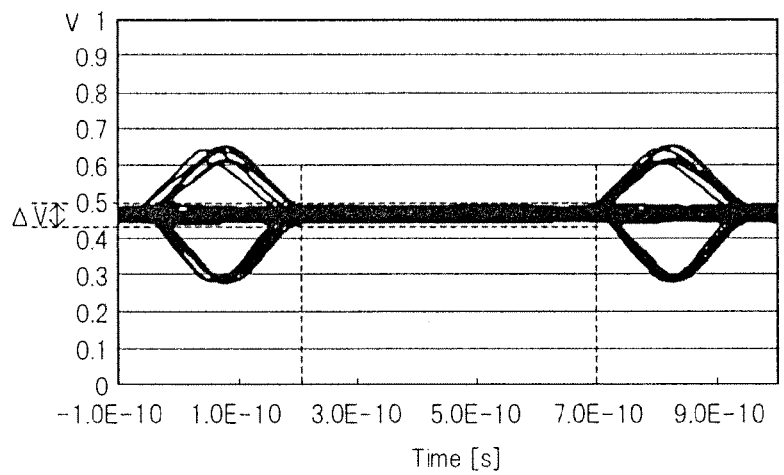
FIG. 3F is a graph showing an example of the output waveform of the DQ signal of the semiconductor device shown in FIG. 1.
Figure 3G:
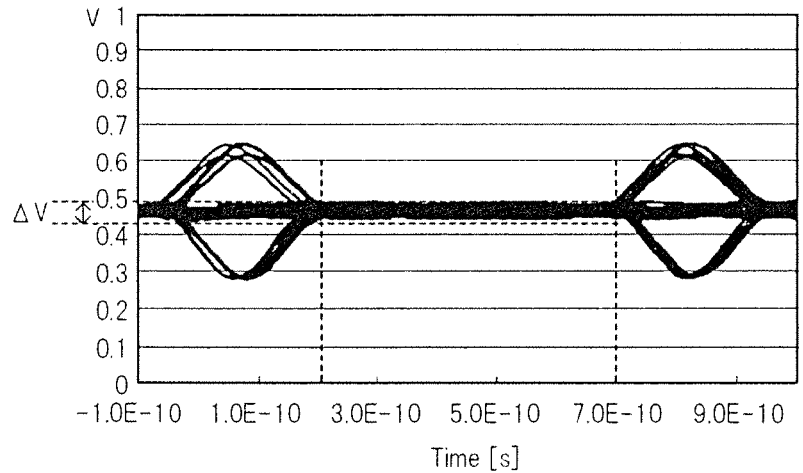
FIG. 3G is a graph showing an example of the output waveform of the DQ signal of the semiconductor device shown in FIG. 1.

If the capacitance of capacitive element 139 is as small as 1 pF or 5 pF, noise between different types of power supplies is generated during a period from about 2e-10 seconds to about 7e-10 seconds of a period corresponding to one cycle of signal DQ-A (a period from 0 seconds to 7e-10 seconds), as shown in FIG. 3A or 3B. For example, in the case shown in FIG. 3A where the capacitance of capacitive element 139 is 1 pF, variation range ΔV of the voltage of signal DQ-A is about 0.2 V.

If the capacitance of capacitive element 139 is not less than 10 pF, as shown in FIGS. 3C to 3G, variation range ΔV of the voltage of signal DQ-A is smaller. For example, in the case shown in FIG. 3G where the capacitance of capacitive element 139 is 50 pF, variation range ΔV of the voltage of signal DQ-A is about 0.06 V, which is about one-third of that when the capacitance of capacitive element 139 is 1 pF. It can thus be seen that noise between different types of power supplies can be reduced by ensuring that the capacitance of capacitive element 139 is not less than a given magnitude.

Variation in the impedance between the VDDQ terminal and the VSSQ terminal and variation in the impedance between the VDDQ terminal and the VSS terminal as seen from output circuit 136, that are caused by the provision of capacitive element 139, will be described.

Figure 4:
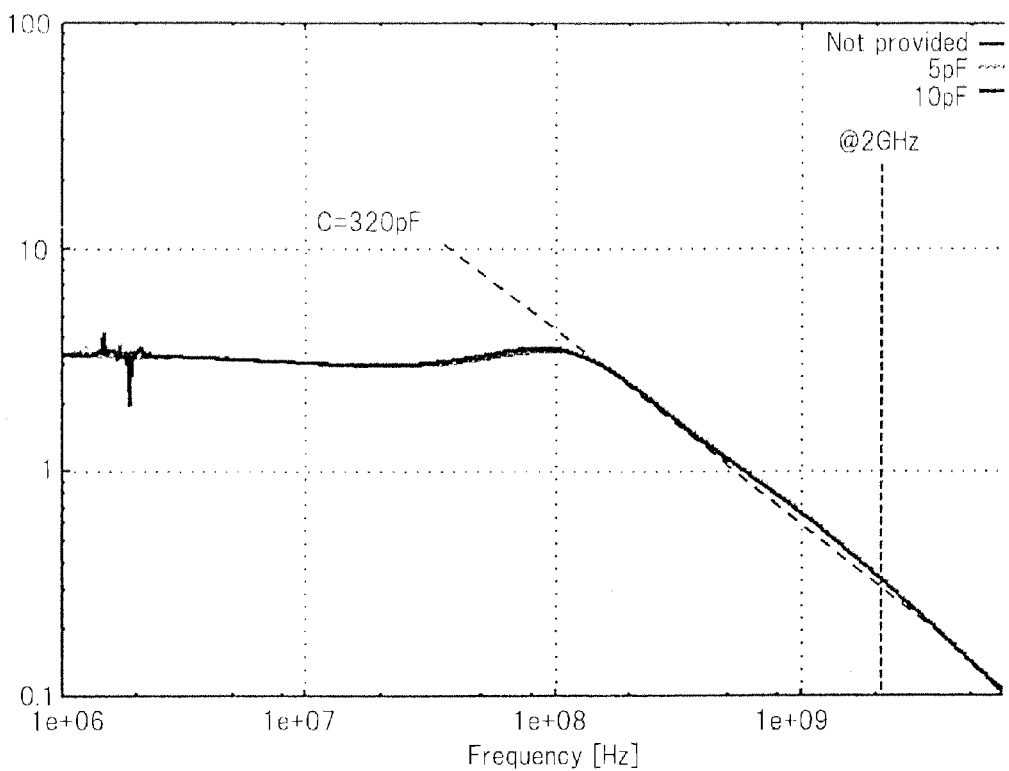
FIG. 4 is a graph showing the impedance between a VDDQ terminal and a VSSQ terminal shown in FIG. 1.

FIG. 4 is a graph showing the impedances between the VDDQ terminal and the VSSQ terminal when capacitive element 139 is not provided, when the capacitance of capacitive element 139 is 5 pF, and when the capacitance of capacitive element 139 is 10 pF. Note that, in FIG. 4, the ordinate represents impedance Z [Ω] between the VDDQ terminal and the VSSQ terminal while the abscissa represents the operating frequency [Hz].

The impedance between the VDDQ terminal and the VSSQ terminal depends on the capacitance of capacitive element 138 provided between I/O power line 133 and I/O ground line 134 when the frequency is not less than 100 MHz. For this reason, there is no difference in the impedance between the VDDQ terminal and the VSSQ terminal from among the cases where capacitive element 139 is not provided, where the capacitance of capacitive element 139 is 5 pF, and where the capacitance of capacitive element 139 is 10 pF, as shown in FIG. 4. Note that the capacitance of capacitive element 138 is assumed to be 320 pF in FIG. 4.

FIGS. 5A to 5G are graphs showing the impedance between the VDDQ terminal and the VSS terminal. Note that FIGS. 5A to 5G show the impedances between the VDDQ terminal and the VSS terminal when capacitive element 139 is not provided, when the capacitance of capacitive element 139 is 5 pF, when the capacitance of capacitive element 139 is 10 pF, when the capacitance of capacitive element 139 is 20 pF, when the capacitance of capacitive element 139 is 30 pF, when the capacitance of capacitive element 139 is 40 pF, and when the capacitance of capacitive element 139 is 50 pF, respectively. In FIGS. 5A to 5G, the ordinate represents impedance Z [Ω] between the VDDQ terminal and the VSS terminal while the abscissa represents the frequency [Hz].

Figure 5A:
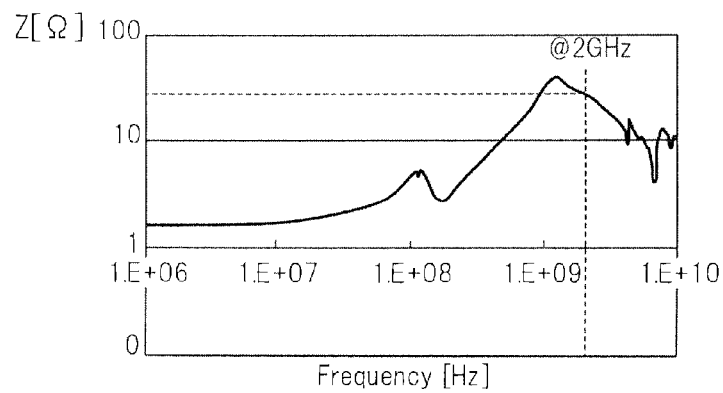
FIG. 5A is a graph showing the impedance between the VDDQ terminal and a VSS terminal shown in FIG. 1.
Figure 5B:
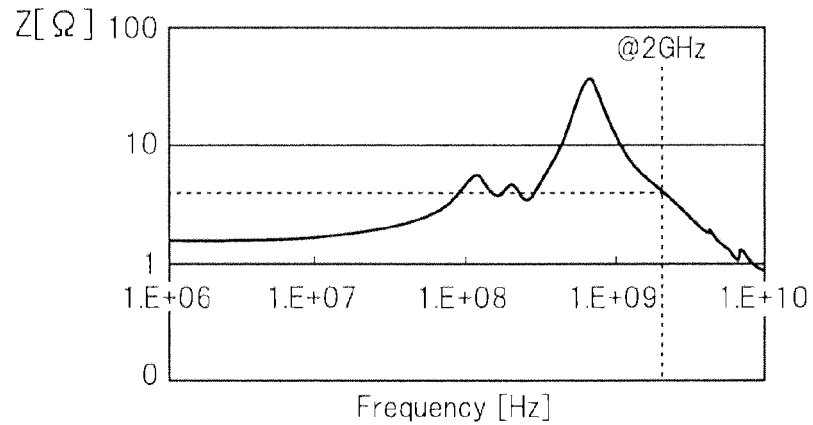
FIG. 5B is a graph showing the impedance between the VDDQ terminal and the VSS terminal shown in FIG. 1.
Figure 5C:
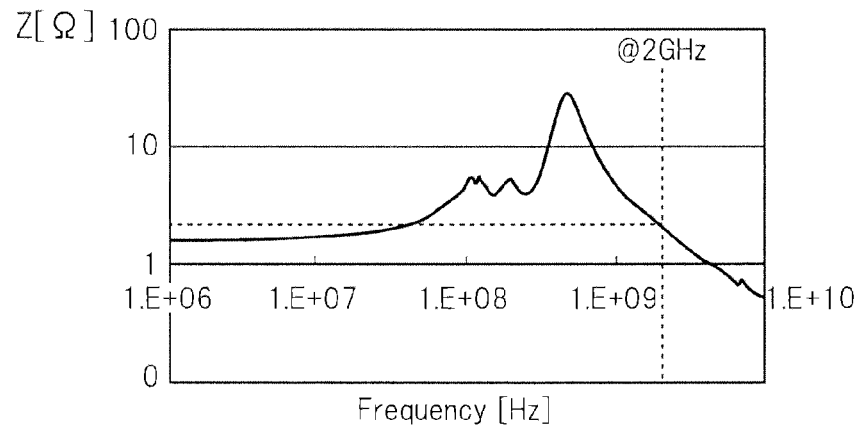
FIG. 5C is a graph showing the impedance between the VDDQ terminal and the VSS terminal shown in FIG. 1.
Figure 5D:
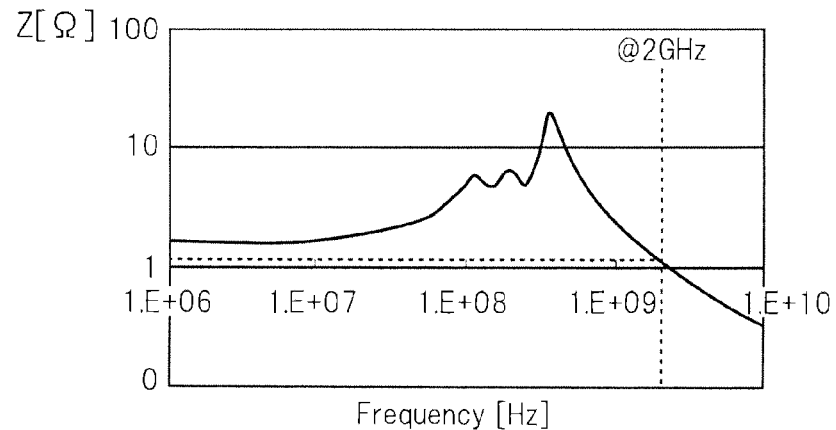
FIG. 5D is a graph showing the impedance between the VDDQ terminal and the VSS terminal shown in FIG. 1.
Figure 5E:
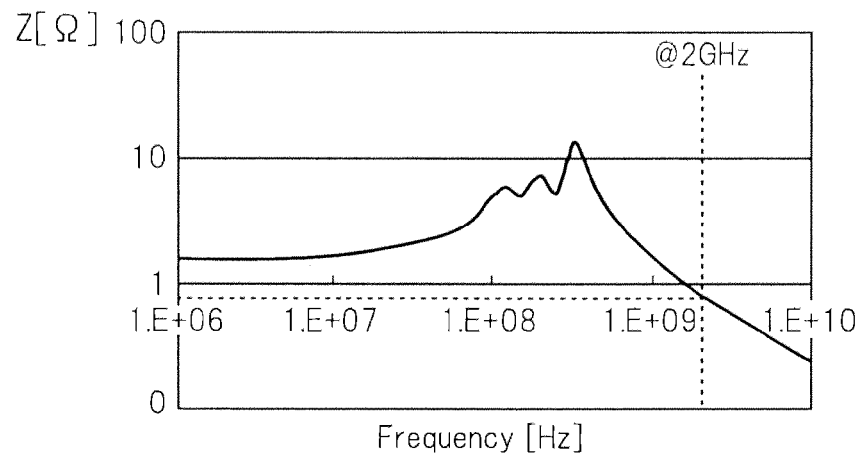
FIG. 5E is a graph showing the impedance between the VDDQ terminal and the VSS terminal shown in FIG. 1.
Figure 5F:
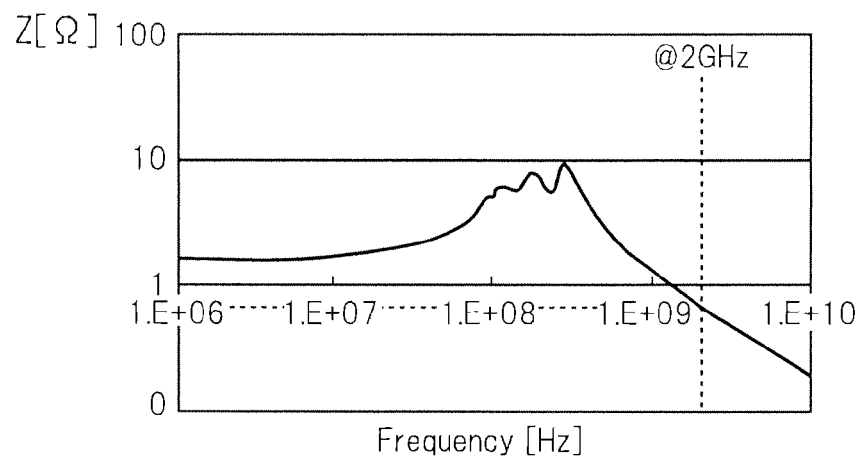
FIG. 5F is a graph showing the impedance between the VDDQ terminal and the VSS terminal shown in FIG. 1.
Figure 5G:
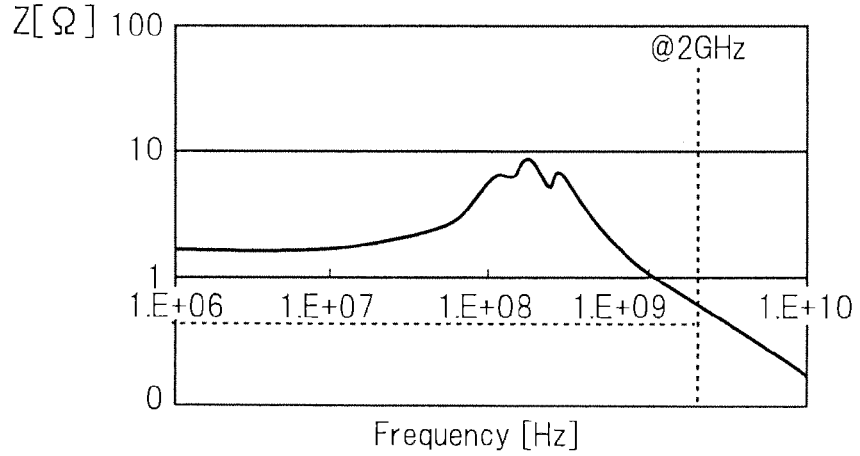
FIG. 5G is a graph showing the impedance between the VDDQ terminal and the VSS terminal shown in FIG. 1.

As shown in FIG. 5A, when capacitive element 139 is not provided, if the frequency is, for example, 2 GHz, impedance Z between the VDDQ terminal and the VSS terminal is about 20Ω.

On the other hand, when capacitive element 139 is provided, as shown in FIGS. 5B to 5G, impedance Z between the VDDQ terminal and the VSS terminal at the same frequency of 2 GHz is lower than that when capacitive element 139 is not provided. For example, when the capacitance of capacitive element 139 is 10 pF, the impedance between the VDDQ terminal and the VSS terminal is about 2Ω, about one order of magnitude smaller than that when capacitive element 139 is not provided. Accordingly, noise between different types of power supplies can be reduced.

As described above, according to the first example of the present invention, semiconductor device 10 includes capacitive element 139 having one end connected to core ground line 132 and the other end connected to I/O ground line 134.

Since capacitive element 139 prevents variation in the difference in potential between core ground line 132 and I/O ground line 134, even when power is supplied to pre-stage circuit 135 via first line 140 using the VDD terminal and VSS terminal, and even when power is supplied to output circuit 136 via second line 141 using the VDDQ terminal and VSSQ terminal, noise between different types of power supplies can be reduced.

Second Example

Figure 6:
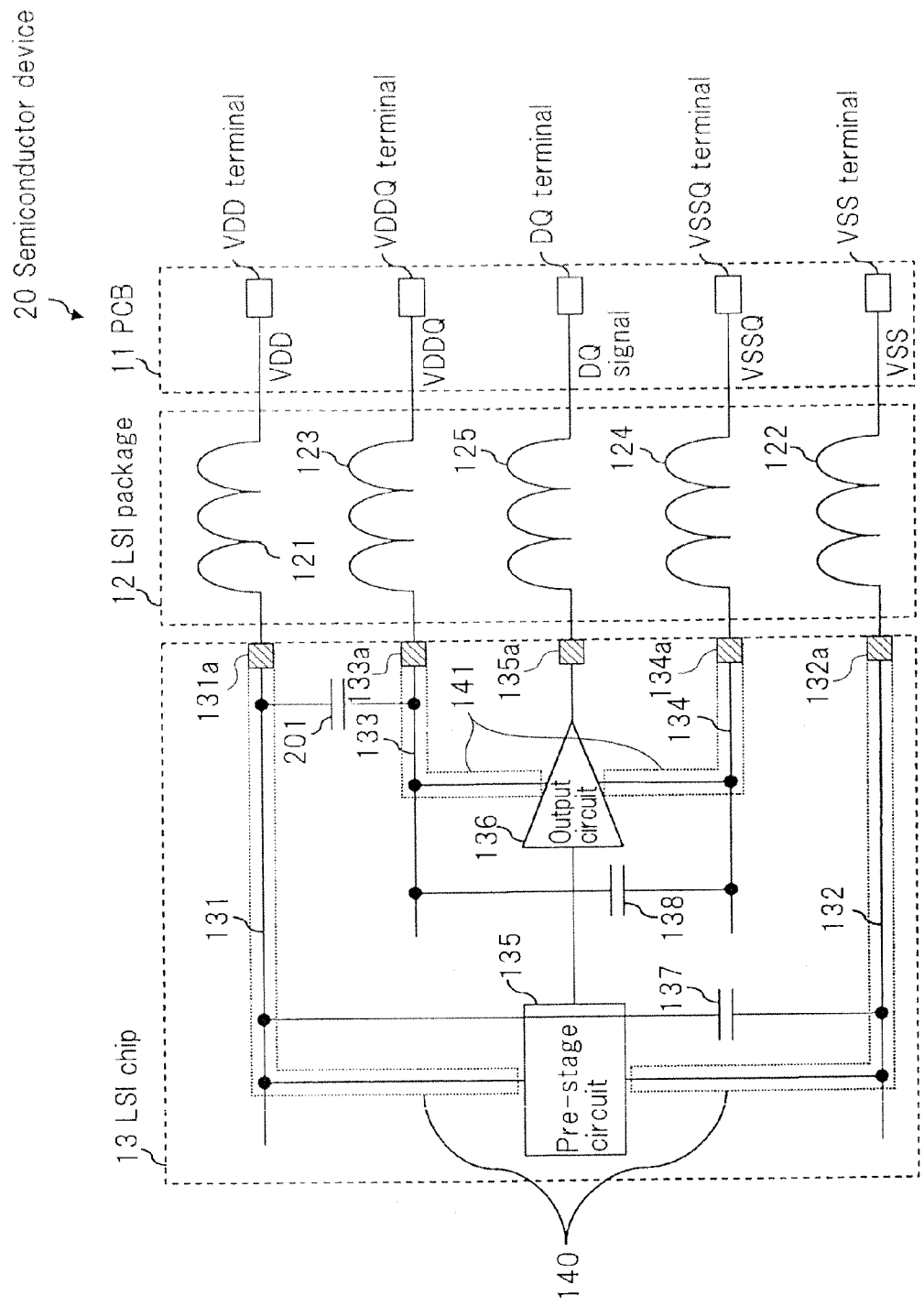
FIG. 6 is a diagram showing the configuration of a semiconductor device according to a second example of the present invention.

The configuration of semiconductor device 20 according to a second example of the present invention will be described with reference to FIG. 6. Note that the same components as those in FIG. 1 are denoted by the same reference numerals and that a description thereof will be omitted.

Semiconductor device 20 is different from semiconductor device 10 according to the first example in that capacitive element 139 is removed and that capacitive element 201 is added.

Capacitive element 201 has one end connected to core power line 131 and the other end connected to I/O power line 133. The provision of capacitive element 201 prevents variation in the difference in potential between core power line 131 and I/O power line 133.

When capacitive element 137 has a capacitance large enough to keep the difference in potential between core power line 131 and core ground line 132 constant, and capacitive element 138 has a capacitance large enough to keep the difference in potential between I/O power line 133 and I/O ground line 134 constant, even if capacitive element 201 is provided between core power line 131 and I/O power line 133, as in the present example, noise between different types of power supplies can be reduced, as in the first example.

Third Example

Figure 7:
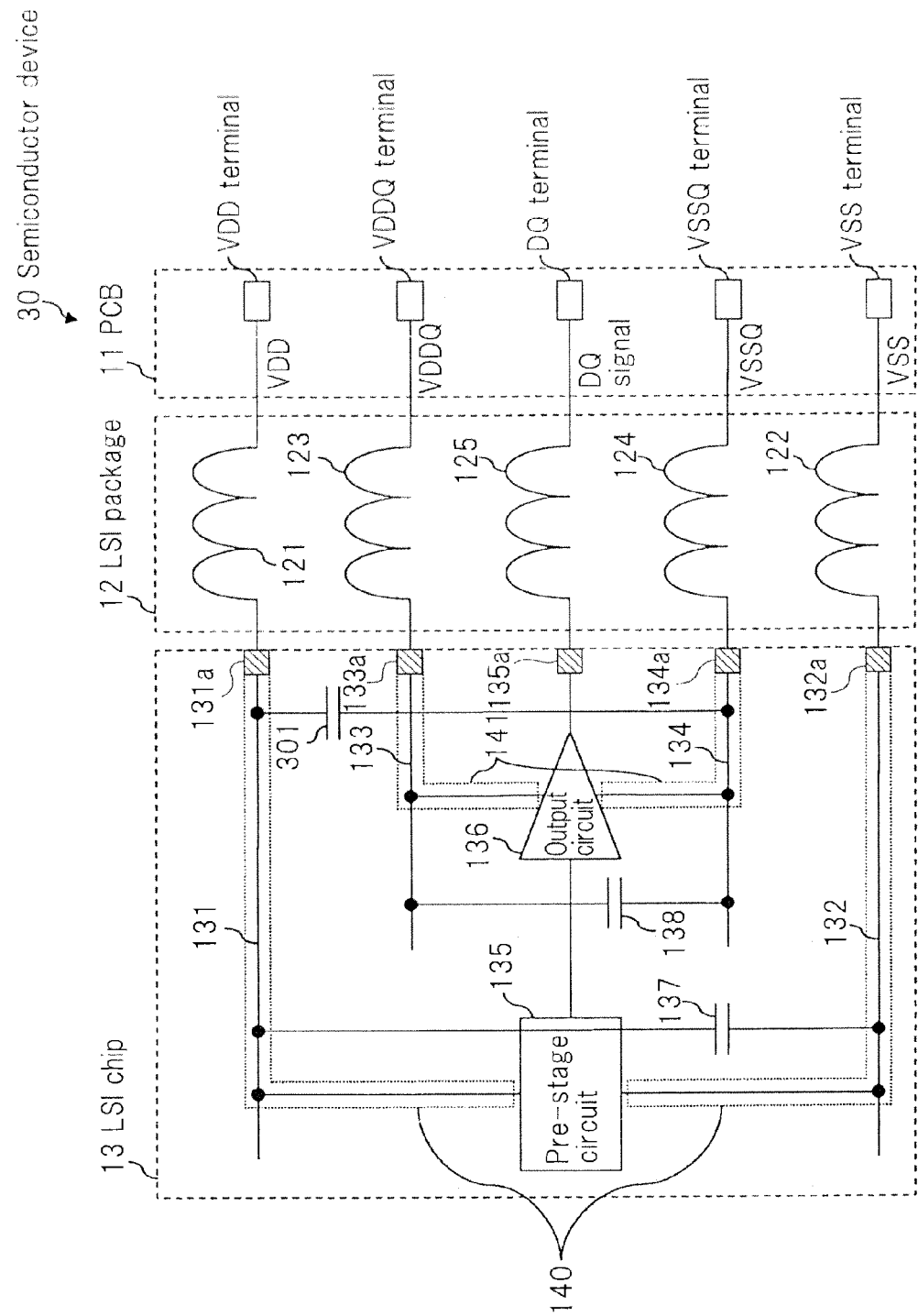
FIG. 7 is a diagram showing the configuration of a semiconductor device according to a third example of the present invention.

The configuration of semiconductor device 30 according to a third example of the present invention will be described with reference to FIG. 7. Note that the same components as those in FIG. 1 are denoted by the same reference numerals and that a description thereof will be omitted.

Semiconductor device 30 is different from semiconductor device 10 according to the first example in that capacitive element 139 is removed and that capacitive element 301 is added.

Capacitive element 301 has one end connected to core power line 131 and the other end connected to I/O ground line 134. The provision of capacitive element 301 prevents variation in the difference in potential between core power line 131 and I/O ground line 134.

When capacitive element 137 has a capacitance large enough to keep the difference in potential between core power line 131 and core ground line 132 constant, and capacitive element 138 has a capacitance large enough to keep the difference in potential between I/O power line 133 and I/O ground line 134 constant, even if capacitive element 301 is provided between core power line 131 and I/O ground line 134, as in the present example, noise between different types of power supplies can be reduced, as in the first example.

Fourth Example

Figure 8:
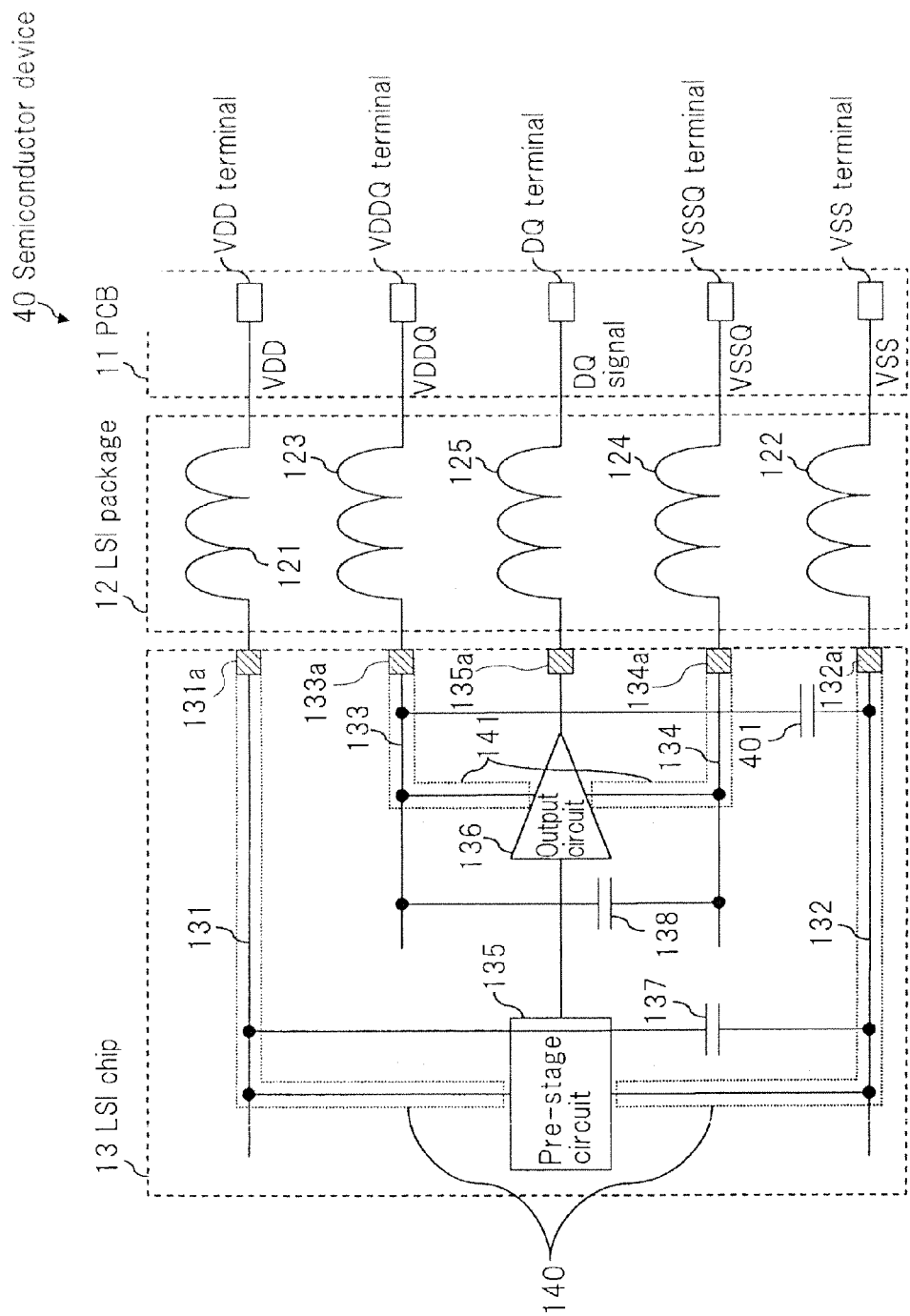
FIG. 8 is a diagram showing the configuration of a semiconductor device according to a fourth example of the present invention.

The configuration of semiconductor device 40 according to a fourth example of the present invention will be described with reference to FIG. 8. Note that the same components as those in FIG. 1 are denoted by the same reference numerals and that a description thereof will be omitted.

Semiconductor device 40 is different from semiconductor device 10 according to the first example in that capacitive element 139 is removed and that capacitive element 401 is added.

Capacitive element 401 has one end connected to core ground line 132 and the other end connected to I/O power line 133. The provision of capacitive element 401 prevents variation in the difference in potential between core ground line 132 and I/O power line 133.

When capacitive element 137 has a capacitance large enough to keep the difference in potential between core power line 131 and core ground line 132 constant, and capacitive element 138 has a capacitance large enough to keep the difference in potential between I/O power line 133 and I/O ground line 134 constant, even if capacitive element 401 is provided between core ground line 132 and I/O power line 133, as in the present example, noise between different types of power supplies can be reduced, as in the first example.

Fifth Example

Figure 9:
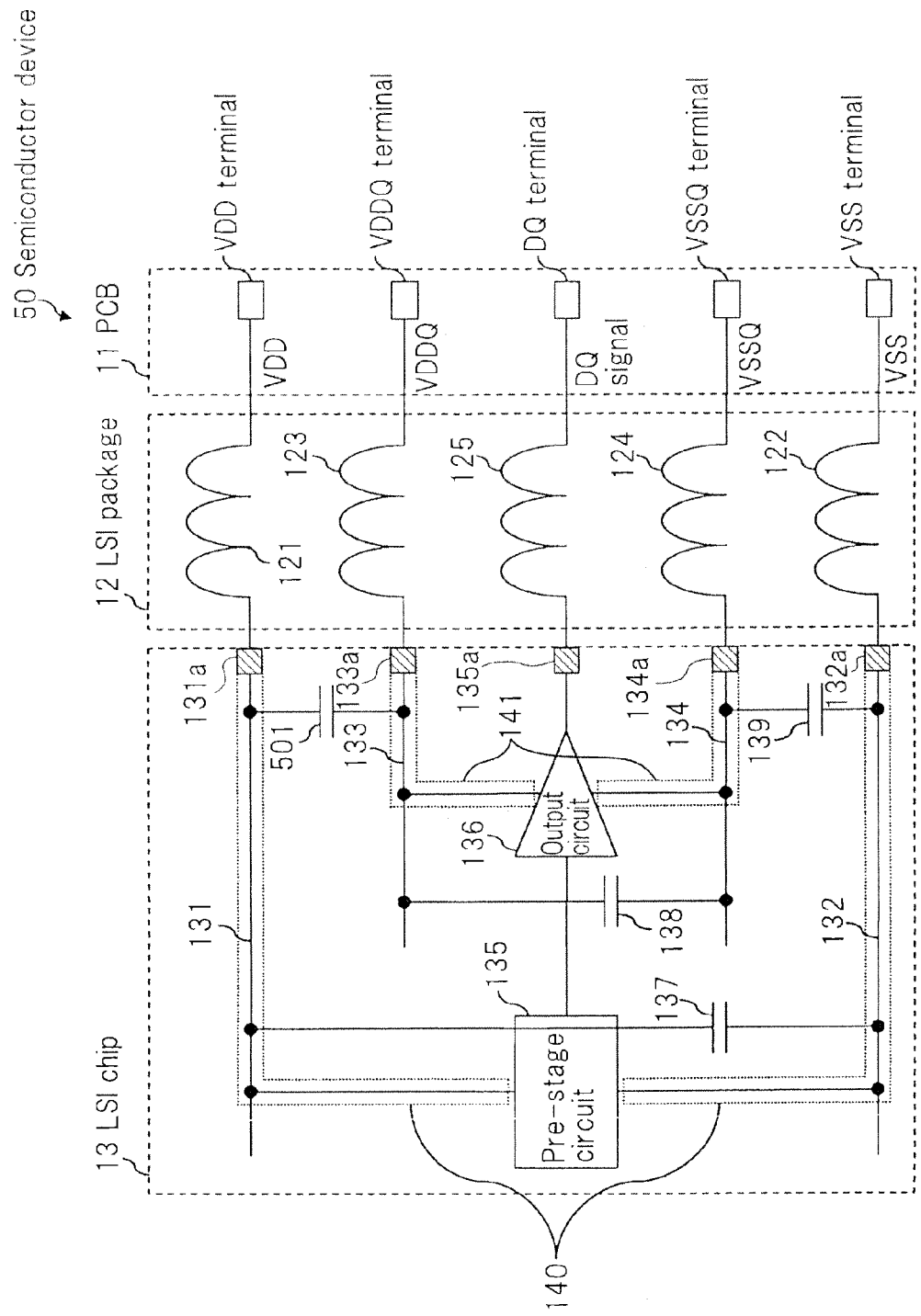
FIG. 9 is a diagram showing the configuration of a semiconductor device according to a fifth example of the present invention.

The configuration of semiconductor device 50 according to a fifth example of the present invention will be described with reference to FIG. 9. Note that the same components as those in FIG. 1 are denoted by the same reference numerals and that a description thereof will be omitted.

Semiconductor device 50 is different from semiconductor device 10 according to the first example in that capacitive element 501 is added.

Capacitive element 501 has one end connected to core power line 131 and the other end connected to I/O power line 133.

That is, semiconductor device 50 according to the present example includes capacitive element 501 as a first capacitive element that is provided between core power line 131 and I/O power line 133 and capacitive element 139 as a second capacitive element that is provided between core ground line 132 and I/O ground line 134.

The provision of capacitive element 501 prevents variation in the difference in potential between core power line 131 and I/O power line 133.

If capacitive element 137 does not have a capacitance large enough to keep the difference in potential between keep core power line 131 and core ground line 132 constant or if capacitive element 138 does not have a capacitance large enough to keep the difference in potential between I/O power line 133 and I/O ground line 134 constant, noise between different types of power supplies can be reduced, as in the first example, by providing a capacitive element between core power line 131 and I/O power line 133 and a capacitive element between core ground line 132 and I/O ground line 134, as in the present example.

Note that although the present example has been described as a case in which capacitive elements are provided between core power line 131 and I/O power line 133 and between core ground line 132 and I/O ground line 134, the present invention is not limited to this. For example, capacitive elements may be provided between core power line 131 and I/O ground line 134 and between core ground line 132 and I/O power line 133.

Sixth Example

Figure 10:
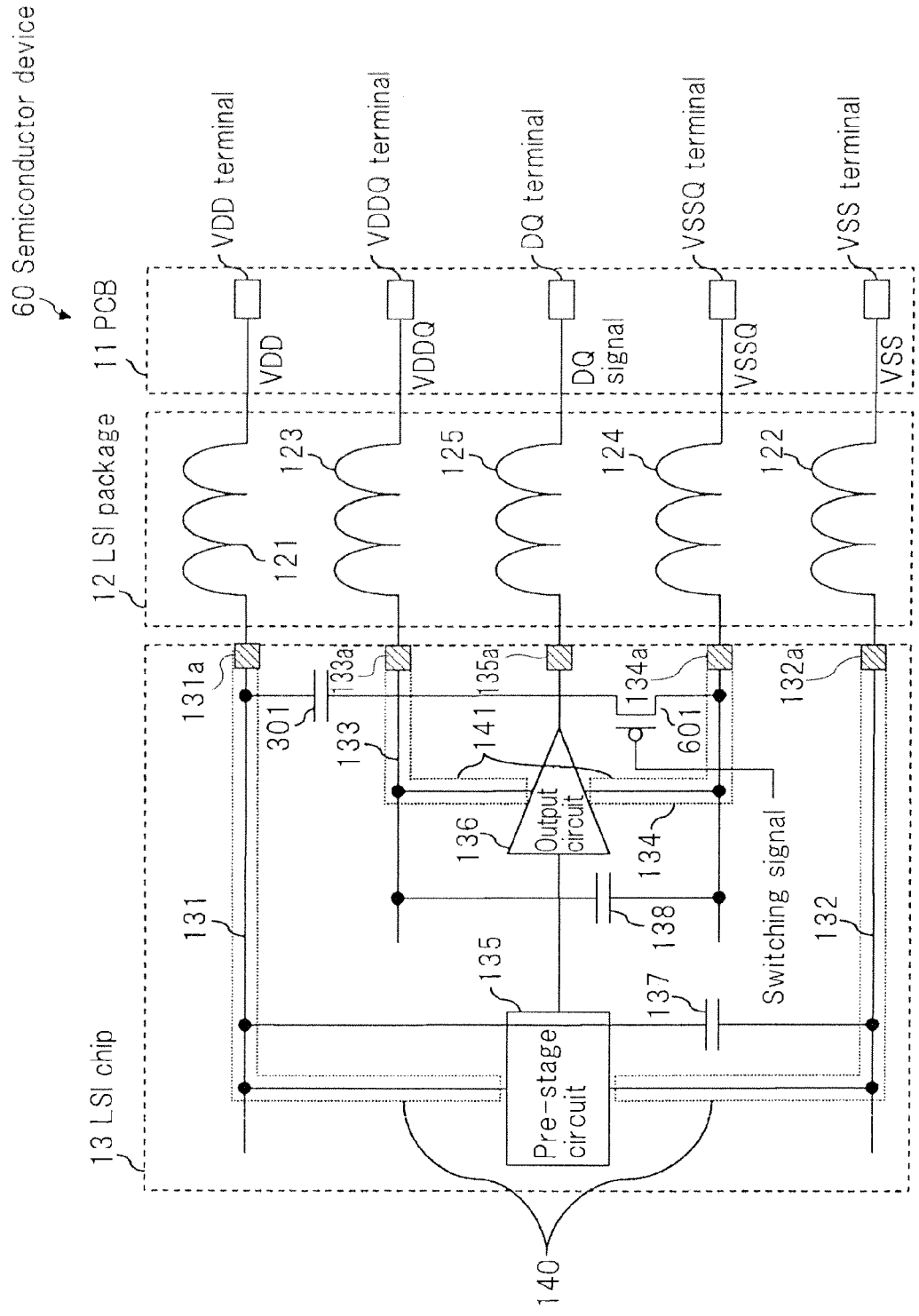
FIG. 10 is a diagram showing the configuration of a semiconductor device according to a sixth example of the present invention.

The configuration of semiconductor device 60 according to a sixth example of the present invention will be described with reference to FIG. 10. Note that the same components as those in FIG. 7 are denoted by the same reference numerals and that a description thereof will be omitted.

Semiconductor device 60 is different from semiconductor device 30 according to the third example in that MOS switch 601 is added.

MOS switch 601 has a source and a drain connected to the other end of capacitive element 301 and I/O ground line 134, respectively, and has a gate to which a switching signal is input. MOS switch 601 is turned on or off in response to an input switching signal.

That is, semiconductor device 60 according to the present example includes capacitive element 301 and MOS switch 601 as a switching element that is connected in series with capacitive element 301.

Although the provision of capacitive element 301 allows a reduction in noise between different types of power supplies, capacitive element 301 may serve as a noise propagation path. Since there is a trade-off between a reduction in noise between different types of power supplies by capacitive element 301 and propagation of noise by capacitive element 301, if the noise propagation has a large effect, noise can be reduced by turning off MOS switch 601 by a switching signal to disable capacitive element 301.

Note that although the present example has been described in as a case in which MOS switch 601 is connected in series with capacitive element 301, the present invention is not limited to this. MOS switch 601 may be provided in series with the capacitive element provided between first line 140 and second line 141 in each of the above-described first, second, fourth, and fifth embodiments.

Seventh Example

Figure 11:
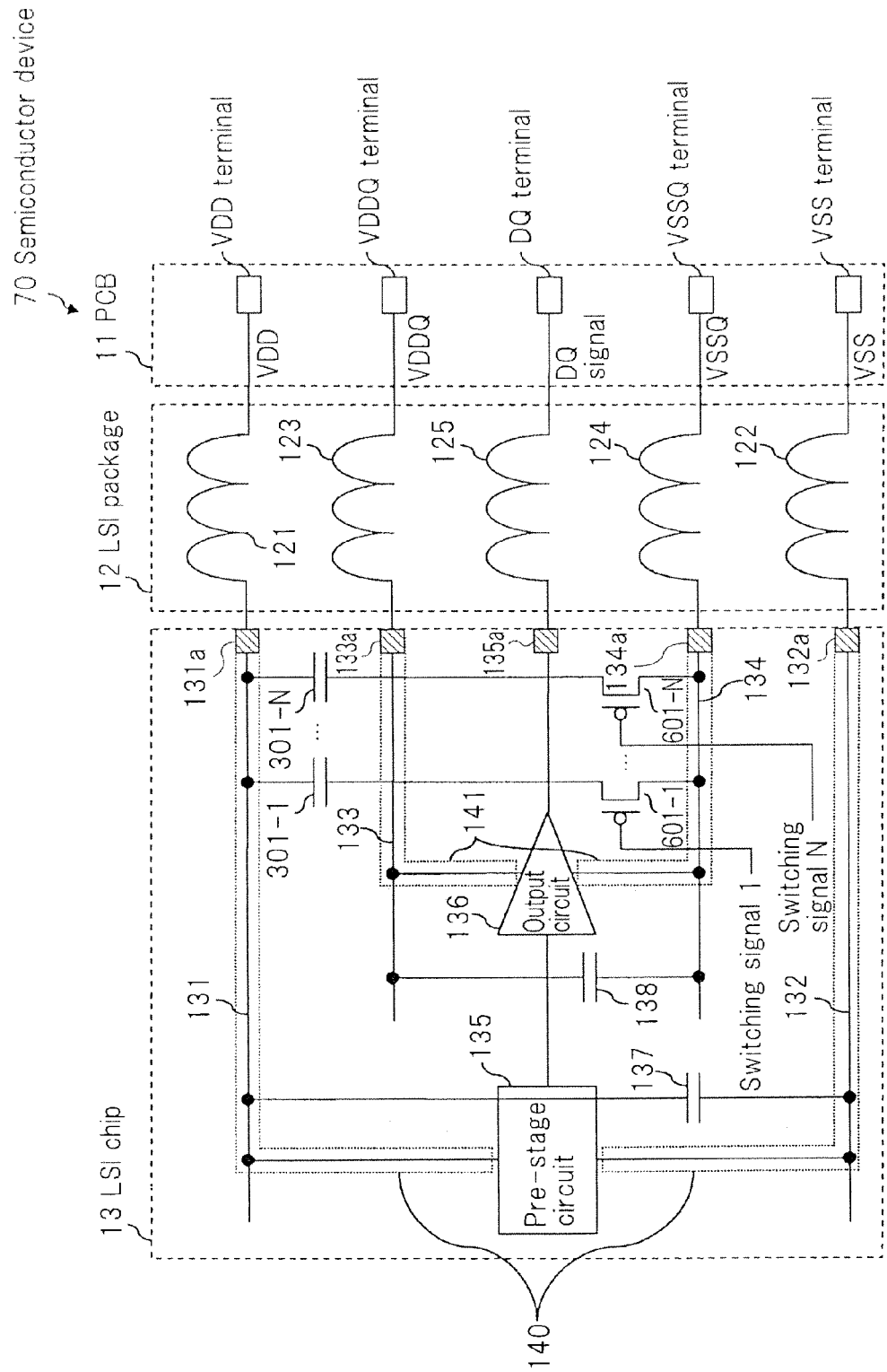
FIG. 11 is a diagram showing the configuration of a semiconductor device according to a seventh example of the present invention.

The configuration of semiconductor device 70 according to a seventh example of the present invention will be described with reference to FIG. 11. Note that the same components as those in FIG. 10 are denoted by the same reference numerals and that a description thereof will be omitted.

Semiconductor device 70 is different from semiconductor device 60 according to the sixth example in that a plurality of capacitive elements 301 and a plurality of MOS switches 601 are provided. That is, semiconductor device 70 includes a plurality of capacitive elements 301-1 to 301-N and a plurality of MOS switches 601-1 to 601-N corresponding to the plurality of capacitive elements 301-1 to 301-N. Note that capacitive elements 301-1 to 301-N will be referred to as capacitive elements 301 hereinafter when capacitive elements 301-1 to 301-N are not distinguished from one another and that MOS switches 601-1 to 601-N will be referred to as MOS switches 601 hereinafter when MOS switches 601-1 to 601-N are not differentiated from one another.

Capacitive elements 301-1 to 301-N connect to first line 140 and second line 141 in the same way. That is, capacitive elements 301-1 to 301-N each have one end connected to core power line 131 and the other end connected to I/O ground line 134 via corresponding MOS switches 601-1 to 601-N.

MOS switches 601-1 to 601-N receive input switching signals 1 to N, respectively, at gates. MOS switch 601 is turned on or off in response to an input switching signal.

As described above, although the provision of capacitive elements 301 allows a reduction in noise between different types of power supplies, capacitive elements 301 may serve as noise propagation paths. There is a trade-off between a reduction in noise between different types of power supplies by capacitive elements 301 and the propagation of noise by capacitive elements 301. It is thus possible to prevent propagation of noise and reduce noise between different types of power supplies by turning each of MOS switches 601-1 to 601-N on and off and by controlling capacitive elements 301 so that compensation capacitance can be adjusted.

Note that although the present example has been described as a case in which a plurality of capacitive elements 301 and a plurality of MOS switches 601 are provided between core power line 131 and I/O ground line 134, the present invention is not limited to this. A plurality of capacitive elements and respective MOS switches connected in series with the capacitive elements may be provided between first line 140 and second line 141 in each of the above-described first, second, fourth, and fifth embodiments.

Eighth Example

The first to seventh examples have been described as a case in which the noise between different types of power supplies in LSI chip 13 has been reduced. The eighth example of the present invention will be illustrated as a case in which the noise between different types of power supplies on PCB 11 has been reduced.

The configuration of semiconductor device 80 according to the present example will be described with reference to FIG. 12. Note that the same components as those in FIG. 1 are denoted by the same reference numerals.

Semiconductor device 80 includes LSI chip 13, VRMs (Voltage Regulator Modules) 801-1 and 801-2, and bypass capacitor 802.

VRM 801-1 is connected to LSI chip 13 via power line VDD1 and ground line VSS1. VRM 801-1 supplies, to LSI chip 13, power potential VDD1 via power line VDD1 and ground potential via ground line VSS1.

VRM 801-2 is connected to LSI chip 13 via power line VDD2 and ground line VSS2. VRM 801-2 supplies, to LSI chip 13, power potential VDD2 via power line VDD2 and ground potential via ground line VSS2. VRM 801-2 is also connected to VRM 801-1 via common ground line 803.

Bypass capacitor 802 has one end connected to ground line VSS1 and the other end connected to ground line VSS2. The provision of bypass capacitor 802 prevents variation in the difference in potential between ground line VSS1 and ground line VSS2.

Figure 12:
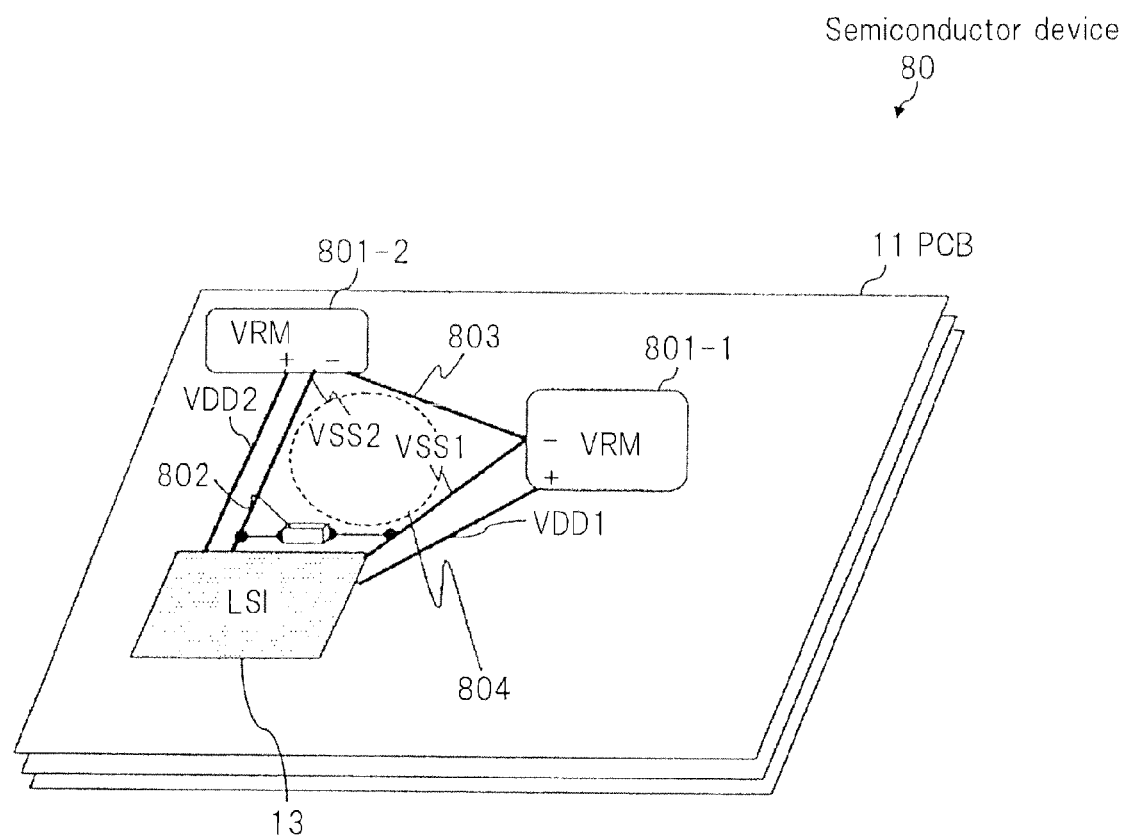
FIG. 12 is a diagram showing the configuration of a semiconductor device according to an eighth example of the present invention.

In semiconductor device 80 shown in FIG. 12, ground line VSS1, ground line VSS2, and common ground line 803 may form a large loop (ground line loop 804). In this case, noise between different types of power supplies is generated via the loop.

For this reason, in the present example, noise between different types of power supplies can be reduced by providing bypass capacitor 802 between ground line VSS1 and ground line VSS2 and keeping the potentials at ground line VSS1 and ground line VSS2 constant. Note that bypass capacitor 802 is desirably mounted as close to LSI chip 13 as possible.

Note that although the first to eighth examples have been described as a case in which the number of types of power supplies is 2, generation of noise can also be prevented even if the number of types of power supplies is not less than 3.

Although the sixth and seventh examples have been described by using a MOS switch as an example, any other element can replace a MOS switch as long as the element has a switching function.

This application is based upon and claims the benefit of priority from the prior Japanese Application No. 2011-255195 filed on Nov. 22, 2011; the entire contents of which are incorporated herein by reference.

It is apparent that the present invention is not limited to the above embodiments, but may be modified and changed without departing from the scope and spirit of the invention.

The invention claimed is:

1. An electronic device comprising:
    first and second power lines that supply an operating voltage to a first circuit comprising an output circuit;
    third and fourth power lines, different from the first and second power lines, that supply an operating voltage to a second circuit different from said first circuit;
    a first capacitive element having one end connected to said first power line and another end connected to said third power line; and
    a second capacitive element having one end connected to said first power line and another end connected to said second power line,
    wherein the second circuit comprises a circuit configured to provide a data signal to the output circuit.

2. The electronic device according to claim 1, further comprising:
    a third capacitive element having one end connected to said third power line and another end connected to said fourth power line.

3. The electronic device according to claim 1, further comprising:
    a third capacitive element having one end connected to said second power line and another end connected to said fourth power line.

4. The electronic device according to claim 1, further comprising:
    a switching element connected in series with said first capacitive element between said first power line and said third power line.

5. The electronic device according to claim 1, further comprising:
    a chip to which first to fourth power supply terminals and an output terminal are connected;
    first to fourth connecting lines that respectively connect said first to fourth power lines to the first to fourth power supply terminals, respectively; and
    an output line that connects the output terminal to the first circuit.

6. A method comprising:
    supplying, via first and second power lines, an operating voltage to a first circuit comprising an output circuit;
    supplying, via third and fourth power lines that are different from the first and second power lines, an operating voltage to a second circuit, different from said first circuit,; and
    providing a data signal to the output circuit via the second circuit,
    wherein between and connected to the first and third power lines is a first capacitive element, and between and connected to the first and second power lines is a second capacitive element.

7. The method according to claim 6, wherein between and connected to the third and fourth power lines is a third capacitive element.

8. The method according to claim 6, wherein between and connected to the second and fourth power lines is a third capacitive element.

9. The method according to claim 6, wherein the electronic device further comprises a switching element connected in series with said first capacitive element between said first power line and said third power line.

10. The method according to claim 6, wherein the electronic device further comprises:
    a chip to which first to fourth power supply terminals and an output terminal are connected;
    first to fourth connecting lines that respectively connect said first to fourth power lines to the first to fourth power supply terminals, respectively; and
    an output line that connects the output terminal to the first circuit.

* * * * *